(12) United States Patent
Hedler et al.

(10) Patent No.: US 8,124,521 B2
(45) Date of Patent: Feb. 28, 2012

(54) ELECTRICAL THROUGH CONTACT

(75) Inventors: Harry Hedler, Germering (DE); Roland Irsigler, München (DE); Volker Lehmann, München (DE); Judith Lehmann, legal representative, München (DE); Thorsten Meyer, Regensburg (DE); Octavio Trovarelli, Dresden (DE)

(73) Assignee: Qimonda AG, Munich (DE)

( * ) Notice: Subject to any disclaimer, the term of this patent is extended or adjusted under 35 U.S.C. 154(b) by 874 days.

(21) Appl. No.: 11/745,145

(22) Filed: May 7, 2007

(65) Prior Publication Data

US 2008/0029850 A1 Feb. 7, 2008

(30) Foreign Application Priority Data

Aug. 1, 2006 (DE) .......................... 10 2006 035 864

(51) Int. Cl.
*H01L 21/4763* (2006.01)

(52) U.S. Cl. ........ 438/618; 438/672; 438/675; 438/667; 438/666; 438/629; 438/109; 257/621; 257/E21.602

(58) Field of Classification Search .................. 257/621, 257/E21.602; 438/618, 109, 972, 675, 667, 438/666, 629
See application file for complete search history.

(56) References Cited

U.S. PATENT DOCUMENTS 5,481,133 A * 1/1996 Hsu ............................... 257/621
(Continued)

FOREIGN PATENT DOCUMENTS

DE 19813239 12/1999
(Continued)

OTHER PUBLICATIONS

The Japanese Office Action for Japanese Application No. 2007-199247 mailed Aug. 4, 2009 (5 pages).
(Continued)

*Primary Examiner* — Junghwa M Im
(74) *Attorney, Agent, or Firm* — Dicke, Billig & Czaja, PLLC

(57) ABSTRACT

A method of fabricating an electrical contact through a through hole in a substrate, wherein the through hole is at least in part filled with a liquid conductive material and the solidified liquid conductive material provides an electrical contact through the through hole.

41 Claims, 14 Drawing Sheets

U.S. PATENT DOCUMENTS

| | | |
|---|---|---|
| 6,448,174 B1 | 9/2002 | Ramm |
| 6,642,081 B1 * | 11/2003 | Patti ............................ 438/109 |
| 6,743,499 B2 | 6/2004 | Suemasu et al. |
| 6,812,549 B2 | 11/2004 | Umetsu et al. |
| 7,217,890 B2 | 5/2007 | Suemasu et al. |
| 7,498,661 B2 | 3/2009 | Matsuo |
| 7,531,115 B2 | 5/2009 | Watanabe et al. |
| 2003/0135997 A1 * | 7/2003 | Watanabe et al. ............... 29/852 |
| 2003/0193076 A1 | 10/2003 | Patti |
| 2005/0035453 A1 | 2/2005 | Ho et al. |

FOREIGN PATENT DOCUMENTS

| | | |
|---|---|---|
| JP | 11298138 A | 10/1999 |
| JP | 2001060654 A | 3/2001 |
| JP | 2002270718 A | 9/2002 |
| JP | 2002368083 | 12/2002 |
| JP | 2003168859 | 6/2003 |
| JP | 2003218200 A | 7/2003 |
| JP | 2004158705 | 6/2004 |
| JP | 2004296488 A | 10/2004 |
| JP | 2004349603 | 12/2004 |
| JP | 2006041247 | 2/2006 |

OTHER PUBLICATIONS

German Examination Report for German Application No. 10 2006 035 864.3 mailed on Jan. 12, 2007.

A translation of Japanese Office Action for Patent Application No. Tokugan 2007-199247 mailed Mar. 30, 2010 (4 pages).

* cited by examiner

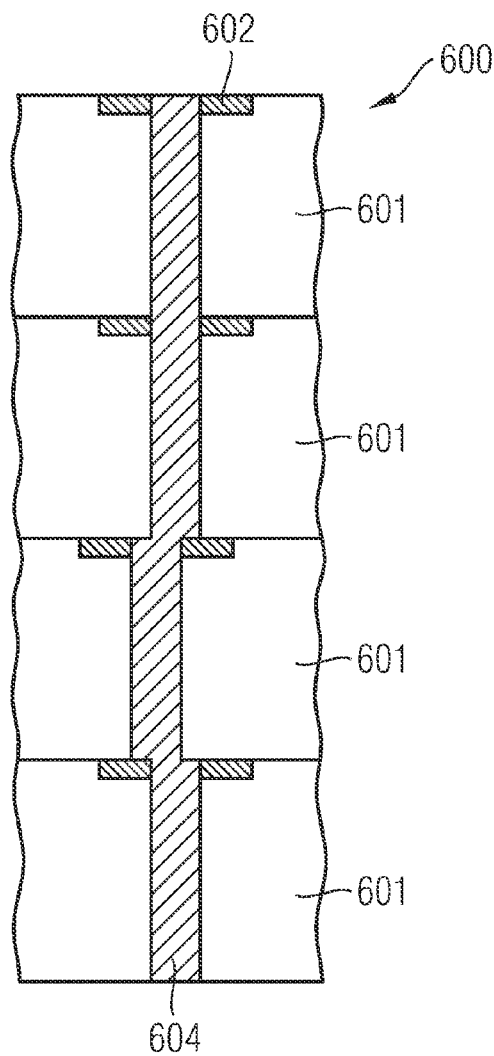
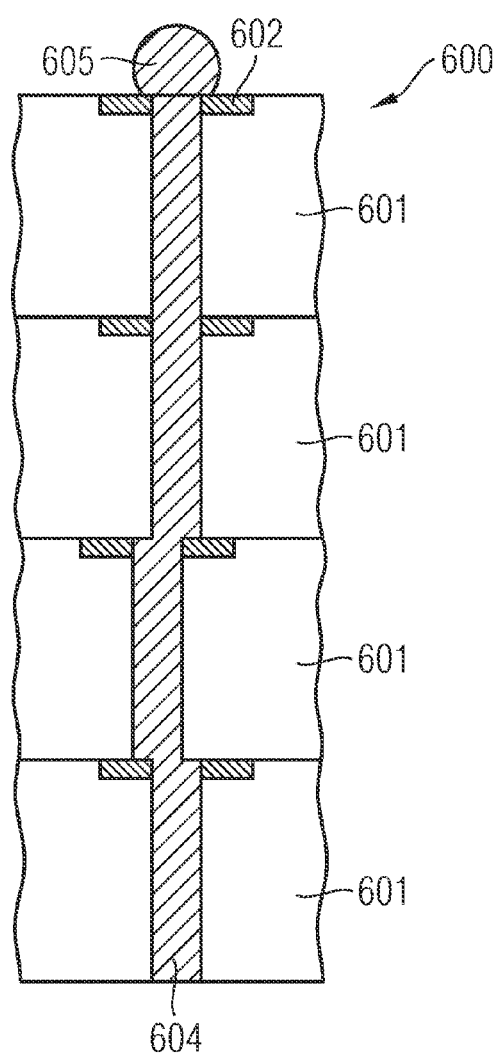

ELECTRICAL THROUGH CONTACT

CROSS-REFERENCE TO RELATED APPLICATIONS

This Utility Patent Application claims priority to German Patent Application No. DE 10 2006 035 864.3, filed on Aug. 1, 2006, which is incorporated herein by reference.

BACKGROUND

To increase the integration and performance of modern integrated circuits, the circuits are also produced on a plurality of substrates which are then arranged in a compact stack form. For this, the circuitry often requires a through hole through a substrate or a through contact, with an individual substrate being part of a substrate stack. The stack may require such electrical through contacts in order to allow signal or else power connection paths from one substrate to another substrate or else from the circuit.

In this context, the through contact, and also the electronically functionalized elements in the substrate, are subject to a compulsion toward miniaturization in order to meet modern requirements in terms of integration and performance. To produce miniaturized through contacts, through holes with diameters in the region of a few microns and below are produced before the individual substrates are stacked, and through appropriate arrangement and orientation in the individual substrates these through holes then form a continuous channel in the substrate stack. The channel can then be filled with a conductive material in order to form the through contact. In this case, the conventional filling of such channels is often done using sputtering or plating methods.

When the liquid conductive material is introduced by capillary forces, one is reliant on the inherent properties of the channel, of the through holes, and of the properties of the channel walls, which are stipulated by the quantity of material and the time in which the material penetrates the channel. When using capillary forces as a driving force, certain restrictions may apply regarding the diameters of the channels, the depth or length of the channels and the materials used. The time which is required in order to introduce the relevant quantity of material into the channel can also be long in the case of given channel dimensions and hence can counteract an effective production process. Often, capillary forces also may not allow reliable filling of the channels with a well-defined and reproducible quantity of material.

SUMMARY

One embodiment is an integrated device and one embodiment is a method of fabricating an electrical contact through a through hole in a substrate. The through hole is at least in part filled with a liquid conductive material and the solidified liquid conductive material provides an electrical contact through the through hole.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 6A through 6D illustrate schematic illustrations of a substrate stack in various stages during manufacturing in line with a sixth embodiment of the present invention.

DETAILED DESCRIPTION

Figure 1A:
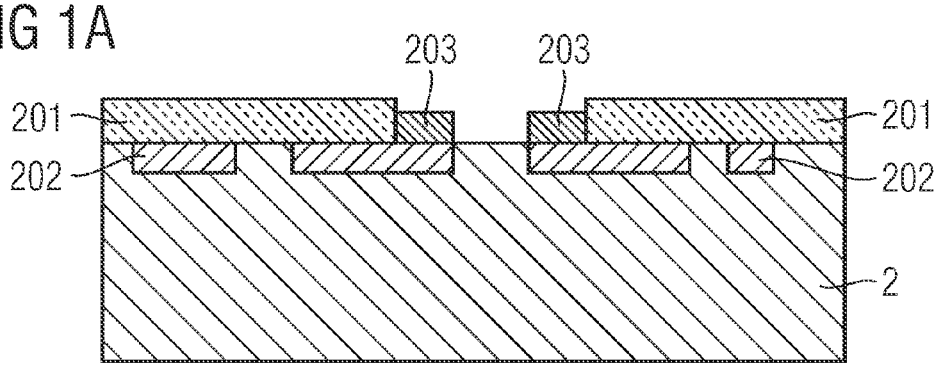
FIGS. 1A through 1D illustrate schematic illustrations of a substrate in various stages during manufacturing in line with a first embodiment of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Various embodiments of the present invention may provide for an improved method of fabricating a functional layer and an improved method of fabricating an integrated device.

In one embodiment, a method of fabricating an electrical contact includes providing a first substrate including at least one contact pad on any of a first surface and of a second surface; providing at least one second substrate including at least one through hole from a first surface to a second surface; stacking the second substrate on the first substrate, such that the through hole of the second substrate at least overlaps with the contact pad of the first substrate; applying a first pressure to the through hole; providing a liquid conductive material to the through hole; applying a second pressure to the liquid conductive material until the through hole is at least partly filled with the liquid conductive material; and taking the stack of substrates off the liquid conductive material.

In one embodiment, a method of fabricating an electrical contact includes the steps of providing a first substrate including at least one contact pad; providing at least one second substrate including at least one blind hole on a first surface of the second substrate; applying a first pressure in the blind hole; providing a liquid conductive material to the blind hole;

applying a second pressure acting to the liquid conductive material, such that the blind hole is at least partly filled with the liquid conductive material; taking the second substrate off the liquid conductive material; flattening the second substrate from a second surface, the second surface being an opposite surface to the first surface, such that the blind hole is opened and a through contact through the second substrate is provided; and stacking the first substrate and the at least one second substrate, such that the through contact of the second substrate overlaps with the contact pad of the first substrate, such that the electrical contact is provided to the through contact.

For one embodiment of the present invention an integrated device includes a substrate stack, the substrate stack including a first substrate, the first substrate including a blind hole and a contact pad, the blind hole being arranged on a surface of the first substrate and the contact pad being arranged on the surface of the first substrate in area of the blind hole; at least one second substrate including a through hole, an aperture of the through hole overlapping with an aperture of the blind hole of the first substrate; and a conductive material filling the through hole of the at least one second substrate, and providing a through contact to the contact pad of the first substrate.

In one embodiment, an integrated device includes a substrate stack, the substrate stack including a first substrate, the first substrate including a through hole and a contact pad, the through hole being arranged on a surface of the first substrate and the contact pad being arranged on the surface of the first substrate in area of the through hole; at least one second substrate including a through hole and a contact pad, the through hole being arranged on a surface of the second substrate and the contact pad being arranged on the surface of the second substrate in area of the through hole, and an aperture of the through hole of the second substrate overlapping with an aperture of the through hole of the first substrate; and a conductive material filling the through holes of the first substrate and of the second substrate, the conductive material providing a through contact to the contact pad of the first substrate.

In one embodiment, a method of fabricating an electrical contact includes the steps of providing a first substrate including a through hole and a contact pad, the contact pad being arranged on a surface of the first substrate in an area of an aperture of the through hole; providing at least one second substrate including a through hole and a contact pad, the contact pad being arranged on a surface of the second substrate in an area of an aperture of the through hole; stacking the second substrate on top of the first substrate, such that the aperture of the through hole of the first substrate at least in part overlaps with the aperture of the through hole of the second substrate; providing a liquid conductive material adjacent to an exposed surface of the first substrate; and applying a first pressure to the through hole and a second pressure to the liquid conductive material, such that the through hole of the first substrate and the second substrate are filled with the liquid conductive material.

In one embodiment, a method of fabricating an electrical contact includes providing a first substrate including a through hole and a contact pad, the contact pad being arranged on a surface of the first substrate in an area of an aperture of the through hole; providing at least one second substrate including a through hole and a contact pad, the contact pad being arranged on a surface of the second substrate in an area of an aperture of the through hole; stacking the second substrate on top of the first substrate, such that the aperture of the through hole of the first substrate at least in part overlaps with the aperture of the through hole of the second substrate; providing a bath of a liquid conductive material; and applying the stack of substrates to the bath of the liquid conductive material, such that the through holes of the first substrate and the second substrate are filled with the liquid conductive material.

In one embodiment, the provision of a low pressure in the through hole before dipping the substrate stack into the liquid conductive material and a subsequent increase in an ambient pressure on the liquid conductive material may force the liquid conductive material into the through hole. This can also be done without any significant contribution by a capillary force or other possible forces and can therefore be controlled not only independently of these forces but also in a well-defined manner. By stipulating the low pressure and the ambient pressure which acts on the liquid conductive material after dipping, it is possible to ensure not only that liquid material enters the through hole but also that the quantity can be stipulated reproducibly. Hence, the inventive method may allow for both a reliable filling even of holes with small diameters and a filling with an adjustable well-defined quantity of the material.

In one embodiment, providing the through hole through the second substrate includes a providing of a blind hole on a first side of the substrate and a flattening of the substrate from a second side which is opposite the first side. By way of example, such a practice also allows the production of through holes through substrates, even when the substrate is initially too thick for direct formation of a through hole using simple planar unselective flattening of the substrate.

In one embodiment, the low pressure is in a range of 0.5 mbar to 100 mbar. The ambient pressure can be increased to atmospheric pressure, essentially to 1 bar. In addition, the ambient pressure can be increased to a pressure in the range of 1 bar to 5 bar. When a low pressure in such a range is chosen, it may be firstly possible for the low pressure to be achieved through pumping using simple pumps, and secondly the increase in the ambient pressure can be achieved through a simple venting of the surroundings of the conductive material. If the ambient pressure is increased further, it may possible to influence the filling with liquid material further.

In one embodiment, the substrate stack is heated to the temperature of the liquid conductive material, before being dipped into the liquid conductive material. This may allow excessive strain on the substrate stack to be prevented, since temperature-induced stress within the stack is avoided. The temperature to which the substrate stack is heated may be in a range of 150° C. to 300° C. In this temperature range, common solder materials, including modern environmentally friendly lead-free solder materials, are in a liquid state.

In one embodiment, the provision of the first substrate having contact areas includes the formation of a blind hole in a region of the contact area in the first substrate. The blind hole can become part of the channel formed by the through holes in the substrates arranged above it, and may be used as a reservoir or equalization volume for filling the through holes with the liquid conductive material. It may thus be possible for a relatively small difference between the low pressure and the ambient pressure prevailing on the liquid material after dipping to be sufficient to fill all through holes with material. In this case, the blind hole can take up an empty volume, such as a void or gas void, produced by the pressure difference and hence ensure the reliable filling of the through holes with the conductive material. In addition, filling the through hole may include at least partial filling of the blind hole with conductive material.

In one embodiment, a passivation layer is additionally provided on a wall of the through hole, on a wall of the blind hole or on an underside of the second substrate. This passivation layer can prevent diffusion of conductive material into the substrates. In addition, the passivation layer can also contribute to the electrical insulation of the plated-through hole from regions of the substrates.

In one embodiment, after the conductive material solidifies a bead made of the conductive material is formed on the topmost substrate in a region of the through hole. This bead including the conductive material is conductively connected to the through contact and can itself be melted again, for example in order to make contact to a contact area on another unit, for example a contact area on a printed circuit board, chip carrier, or package.

In one embodiment, the conductive material used is a metal solder. Metal solders are easily liquefied by heating them above the melting point and are normally solid upon cooling to room temperature and therefore form a reliable and solid through contact.

In one embodiment, the blind hole may be at least partially filled with the conductive material. In addition, a passivation layer may be arranged on the wall of the blind hole and/or of the through hole. This passivation layer can prevent diffusion of conductive material into the substrates. In addition, the passivation layer can also contribute to the electrical insulation of the through contact from regions of the substrates.

In one embodiment, the conductive material includes a metal solder. Metal solders may be easily liquefied by heating them above the melting point and are normally solid upon cooling to room temperature and therefore form a reliable and solid through contact.

In one embodiment of the present invention, the second substrate includes a contact pad in a region of an aperture or opening of the through hole. This may allow the through contact to be connected to the contact pad and hence to functionalized regions of the substrate. A contact pad may include a pad, a contact eye, or a contact sleeve.

In one embodiment, two substrates include an intermediate layer arranged between them which joins the two substrates to one another. The joining intermediate layer may keep the relative position between two substrates constant, and the stack may thus be of sequential design without altering the relative position of the substrates which have already been stacked. This may effectively suppresses any unwanted offset or misalignment in the orientation and positioning of the through holes, the blind holes, and other functionalized elements.

In one embodiment, a passivation layer is arranged between two substrates. This passivation layer can prevent diffusion of conductive material into the substrates. In addition, the passivation layer can also contribute to the electrical insulation of the substrates from one another.

In one embodiment, the substrates include a frame, and the through holes and the blind holes are arranged in the frame. The frame may also include a polymer material. The frame may be part of a housing or package for the integrated circuit and may effectively protect the chips and functionalized electronic elements arranged in the substrate. The through contacts therefore may not need to be made in the chip, the latter often being a sensitive unit as regards mechanical and thermal processing and also as regards the diffusion of conductive material.

In one embodiment, beads made of the conductive material (are arranged on the topmost substrate in a region of the through hole. This means that the substrate stack can be connected directly to other units, for example a printed circuit with contact areas.

In one embodiment, two substrates have an interposer or redistribution layer arranged between them which connects the substrates to the through contacts. The interposer or redistribution layer can connect even functionalized regions of a substrate which are physically remote from the through contact to the through contact. Thus, functionalized regions of a chip can also be connected to through contacts in a frame, for example.

FIG. 1A schematically illustrates a second substrate 2 with functionalized regions 202. Within the context of an integrated circuit, the functionalized regions 202 may be interconnects, insulation or diffusion barriers, doped regions or else dielectric structures, for example. The materials used are silicon and the other materials which are customary in the semiconductor industry. One surface of the second substrate 2 also includes a passivation layer 201 arranged on it. The passivation layer 201 may include oxides or nitrides (for example, $SiO_2$ or $Si_3N_4$). In addition, the surface of the passivation layer 201 may have an intermediate layer arranged on it for joining two substrates. This intermediate layer may include a polymer adhesion layer, for example. An opening in the passivation layer 201 also includes a wettable region 203 arranged in it. The wettable region 203 can include metals, for example aluminum, copper, tin, gold, inter alia, in order to be wetted by metal solders. In addition, the wettable region 203 has an opening which frees the second substrate 2 on one surface. To produce and implement the functionalized regions 202, the passivation layer 201 and the wettable regions 203, inherently known production methods, such as parts of a CMOS production process, are used.

Figure 1B:
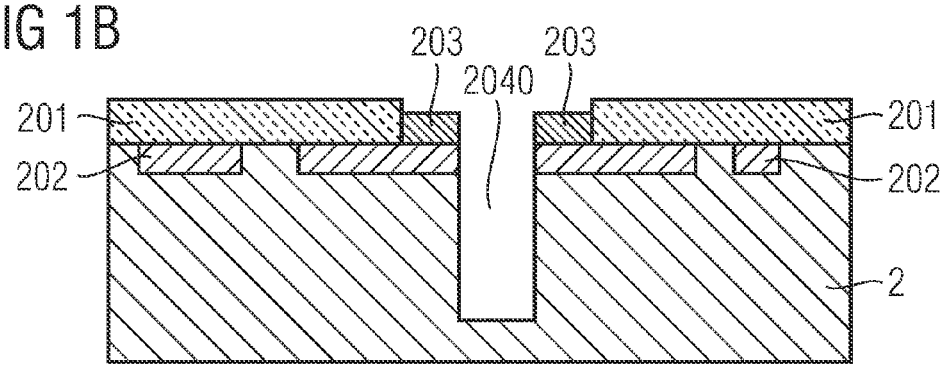

FIG. 1B illustrates the second substrate 2 in which a blind hole 2040 has been made. The hole 2040 can be made using customary methods, such as anisotropic etching, dry etching, anisotropic wet etching, etching with the assistance of an electrical field or laser etching. The diameter of the blind hole 2040 is typically in a range from 100 nm to 10 µm. The depth is dependent on an aspect ratio, defined as the ratio between the hole depth and the hole diameter, in a range from 2 to 10, but typically greater than 3.

Figure 1C:
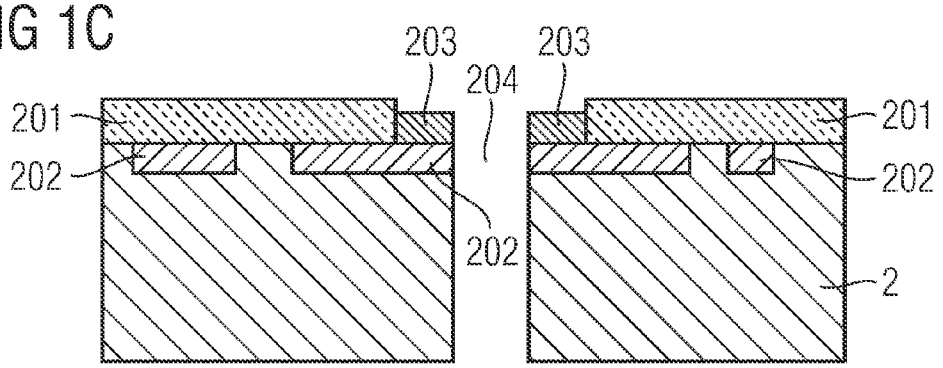

FIG. 1C illustrates the second substrate 2 after it has been flattened from the underside. Flattening of this kind turns the blind hole 2040 into a through hole 204. Flattening can be achieved by a polishing process, for example, chemical mechanical polishing (CMP). If either the original thickness of the second substrate 2 is small enough or a hole 2040 of sufficient depth can actually be produced in the aforementioned step then a through hole 204 can be produced directly, and it is therefore possible to dispense with flattening the second substrate 2 from the underside.

Figure 1D:
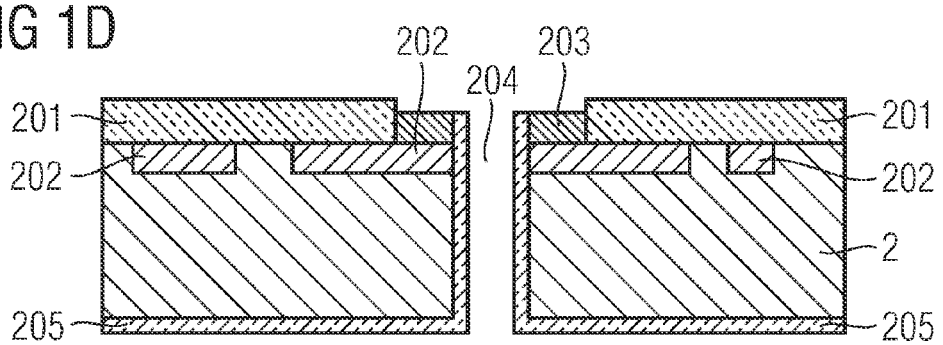

FIG. 1D illustrates the second substrate 2 including the through hole 204. A further passivation layer 205 has been put onto the walls of the through hole 204 and onto the underside of the second substrate 2. The further passivation layer 205 can be used for insulation in order to provide adequate electrical insulation between functionalized regions in the second substrate 2 and the through contact which is subsequently produced in the through hole 204. In addition, the further passivation layer 205 can be used as a diffusion barrier in order to significantly inhibit the diffusion of material from or into the through contact. A suitable material for the further passivation layer 205 may be silicon oxide ($SiO_2$), for example.

Figure 2A:
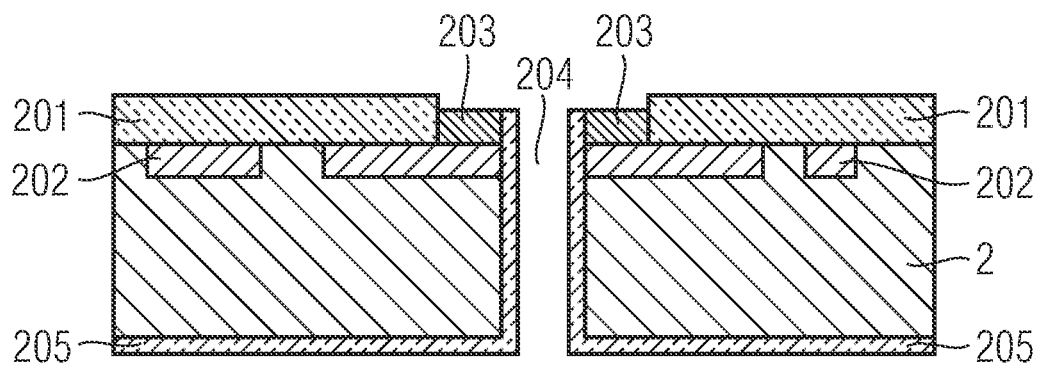
FIGS. 2A through 2C illustrate schematic illustrations of an integrated circuit during manufacturing in line with a second embodiment of the present invention.
Figure 2A:
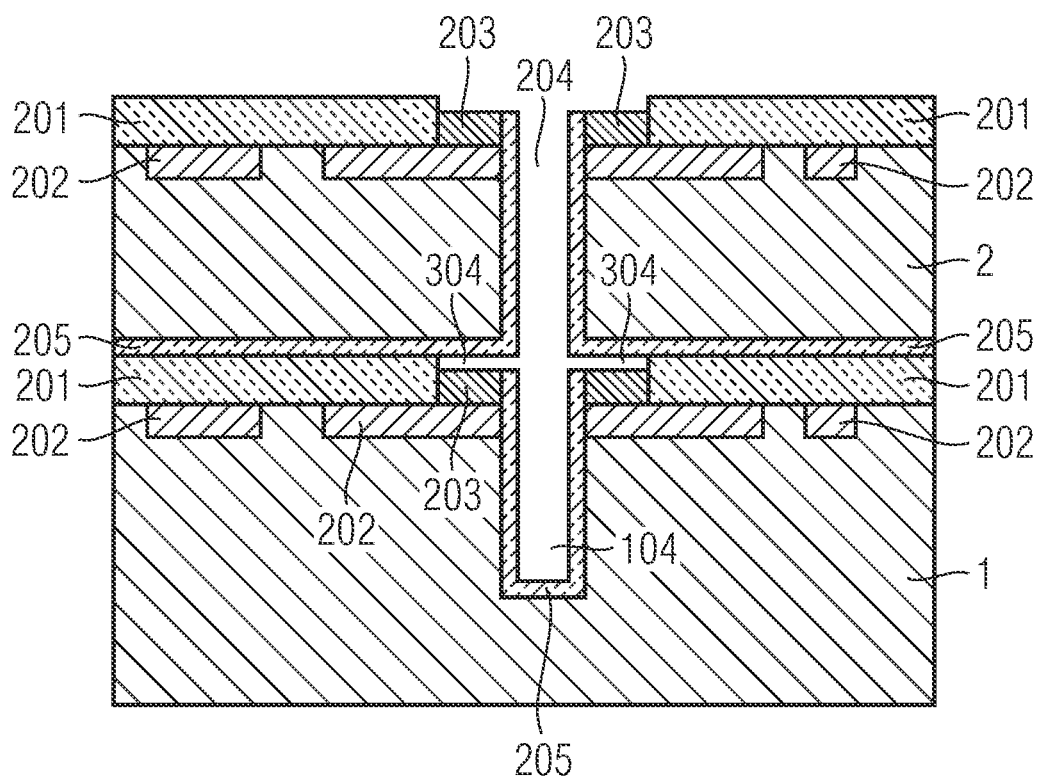

FIG. 2A schematically illustrates the stacking of a first substrate 1 with at least a second substrate 2 to form a substrate stack. Besides the at least one second substrate 2, which has been described in more detail in FIGS. 1A through 1D, a substrate stack also may include a first substrate 1. The first substrate 1 includes a blind hole 104 in a region of a wetting region 203. The first substrate 1 can also include functionalized regions 202, a passivation layer 201 and also intermediate layers arranged in it to promote adhesion among the substrates. The blind hole 104 can also include a further passivation layer 205 on its walls.

To form a through contact, the through holes 204 in the second substrates 2 and the blind hole 104 in the first substrate 1 form a continuous channel. This channel can include cavities 304 as a result of the stacking of the substrates and as a result of the layer thickness of the wettable region 203 being reduced in comparison with the passivation layer 201. These cavities 304 may also be filled by a conductive liquid material in the course of further production and thus allow contact to be made with the relevant wettable regions 203 and the relevant functionalized regions 202. As FIG. 2A illustrates, a second substrate 2 has already been stacked on the first substrate 1, and a further second substrate 2 is just being laid on the stack.

Figure 2B:
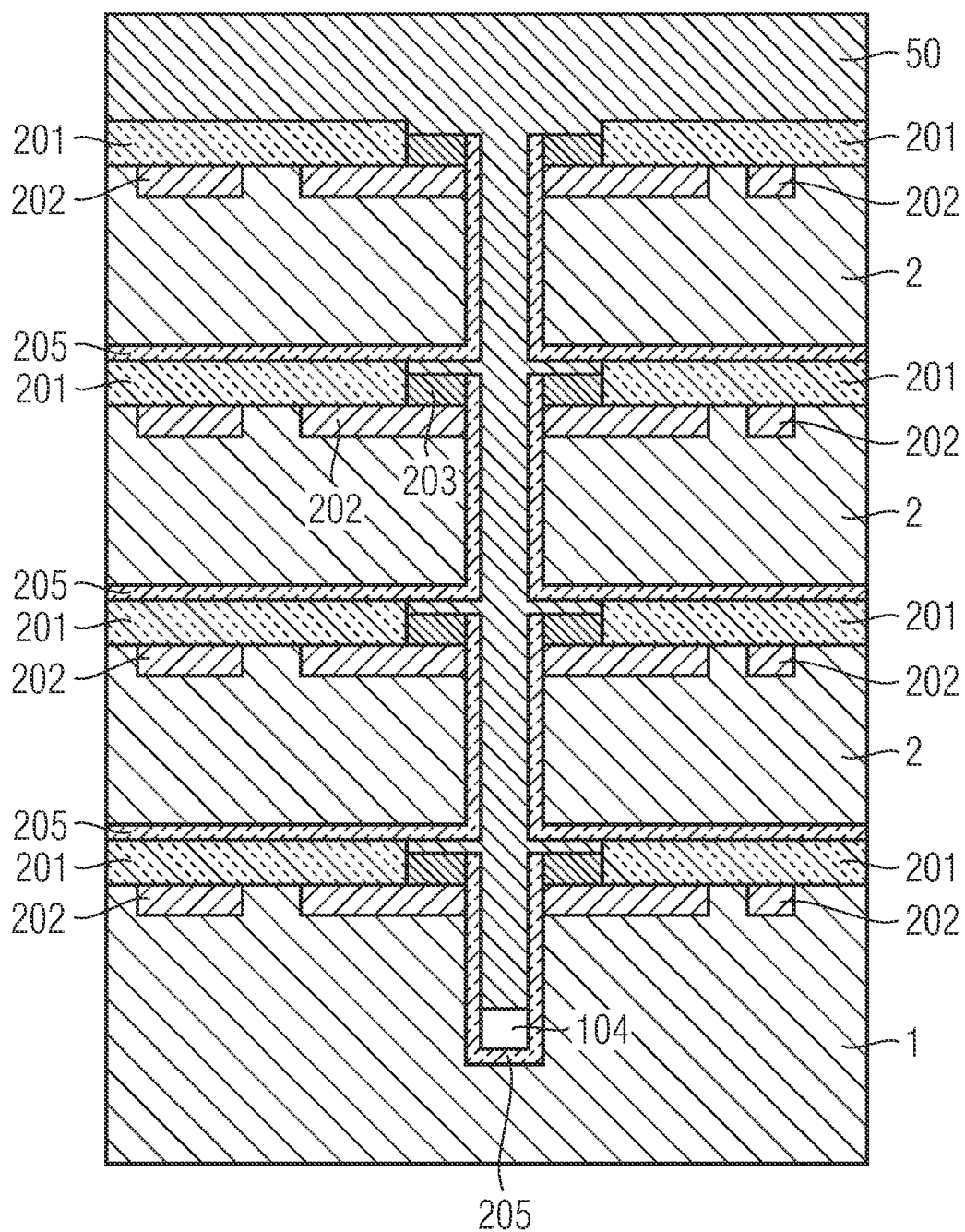

FIG. 2B illustrates a substrate stack, in this case including three second substrates 2 and one first substrate 1, by way of example. In the channel, for example, in the through holes 204 in the second substrates 2, in the cavities 304 and in the blind hole 104 in the first substrate 1, a low pressure is produced. The substrate stack is then brought into contact with a liquid conductive material 50 at an opening in the topmost through hole, and an ambient pressure on the liquid conductive material 50 is then increased.

As illustrated here, this forces the liquid conductive material 50 into the channel, that is, into the through holes 204 in the second substrates 2, into the cavities 304 and also at least partially into the blind hole 104 in the first substrate 1. An empty residual volume may remain in the blind hole 104 in the first substrate 1. This empty residual volume includes residual gases and is essentially dependent on the pressure difference between the low pressure and the ambient pressure on the liquid conductive material 50 after it has been increased.

Figure 2C:
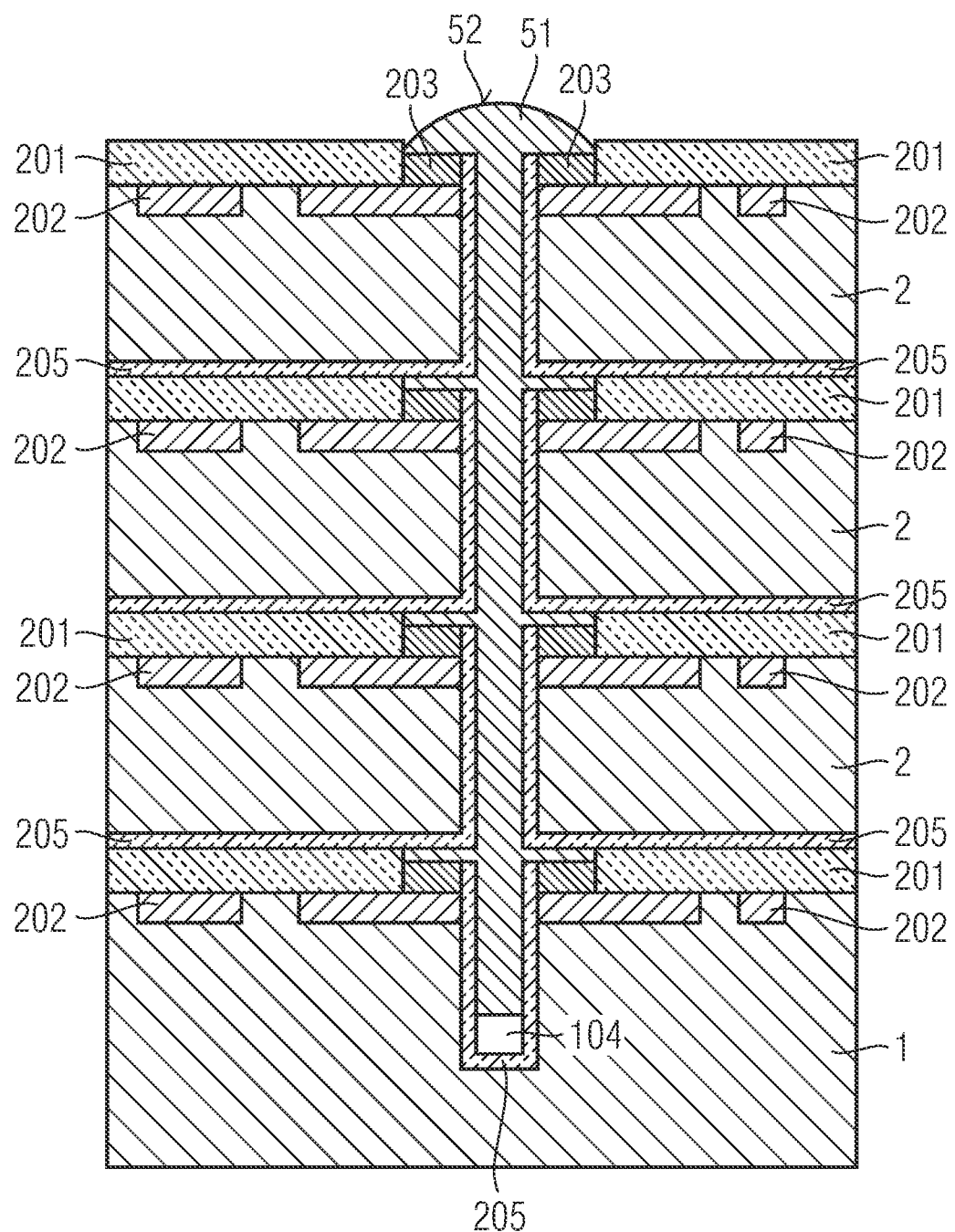

FIG. 2C illustrates the substrate stack after the remaining liquid conductive material 50 has been removed from the substrate stack and the liquid conductive material in the channel of the through holes 204 and the blind hole 104 has solidified. The material therefore forms a through contact 51 and there usually remains a material residue 52 on the topmost contact pad, formed by the topmost wetting regions 203 and the relevant functionalized regions 202. In addition, the liquid conductive material 50 in the channels including the through holes 204, the cavities 304 and the blind holes 104 can be cooled more quickly from the front, that is, from the topmost second substrate 2, than from the back. Liquid conductive material from the blind holes 104 can therefore compensate for the shrinkage in the volume during solidification of the conductive material, and thus ensure a constant and reliable through contact 51 with connection of all substrates and wetting areas 203.

Figure 3:
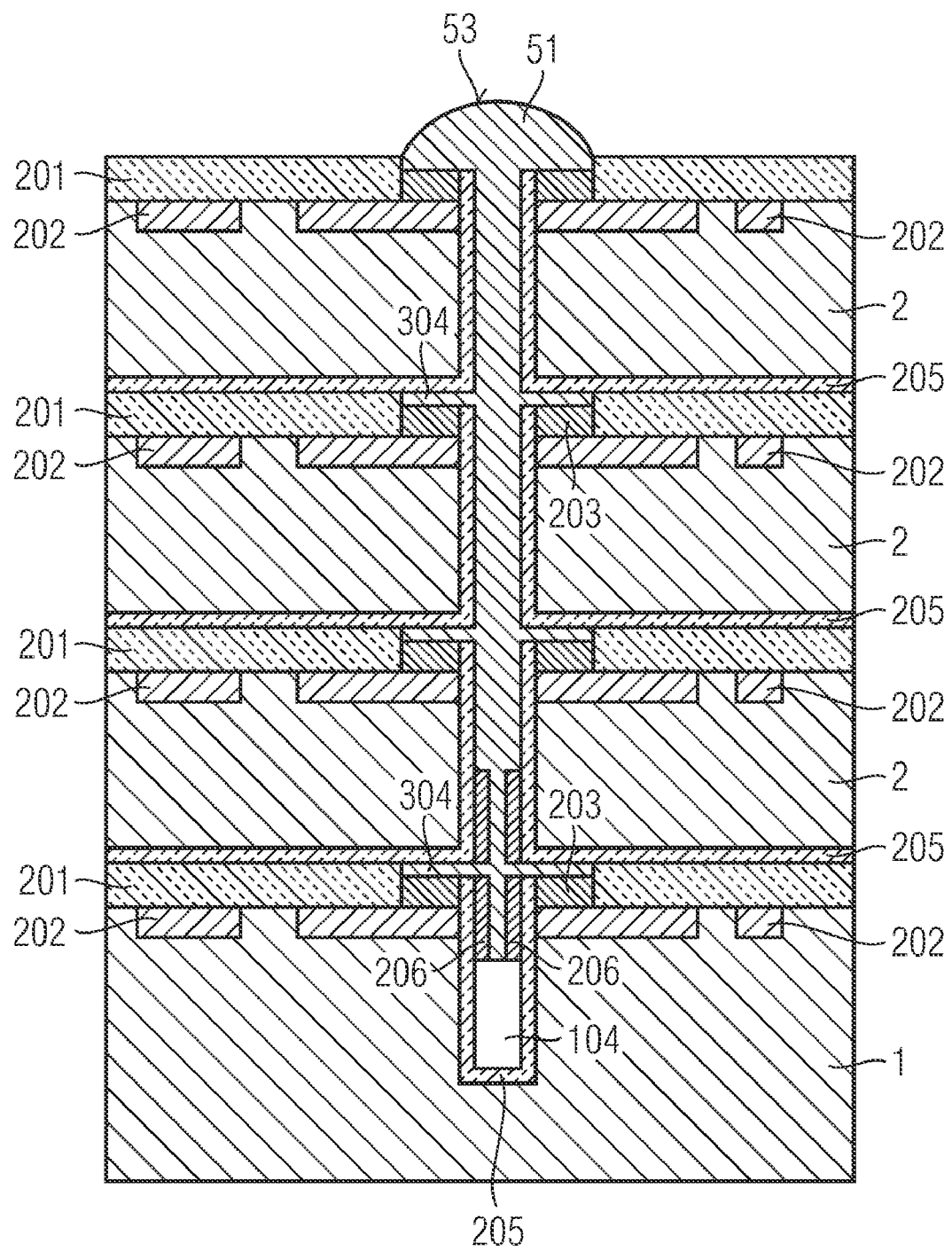
FIG. 3 illustrates a schematic illustrations of an integrated in line with a third embodiment of the present invention.

FIG. 3 illustrates the substrate stack from FIGS. 2A through 2C, where the material residue 52 has a contact bead 53. The size of the contact bead 53 can be set by the empty volume in the blind hole 104 in the first substrate 1 and using the pressure difference between the low pressure and the ambient pressure. In addition, the substrate stack may have partial metalliations 206 wholly or in part in the through holes 204 and the blind hole 104. The metalliations 206 wet the conductive material and can therefore also determine the quantity of liquid material in the channel of the through holes 204 and in the blind hole 104. The stacking of the substrates and the reduced layer thickness of the wettable region 203 in comparison with the passivation layer 201 produce cavities 304. These cavities 304 may also be filled by the conductive liquid material and thus may allow contact to be made with the relevant wettable regions 203 and the relevant functionalized regions 202.

Figure 4:
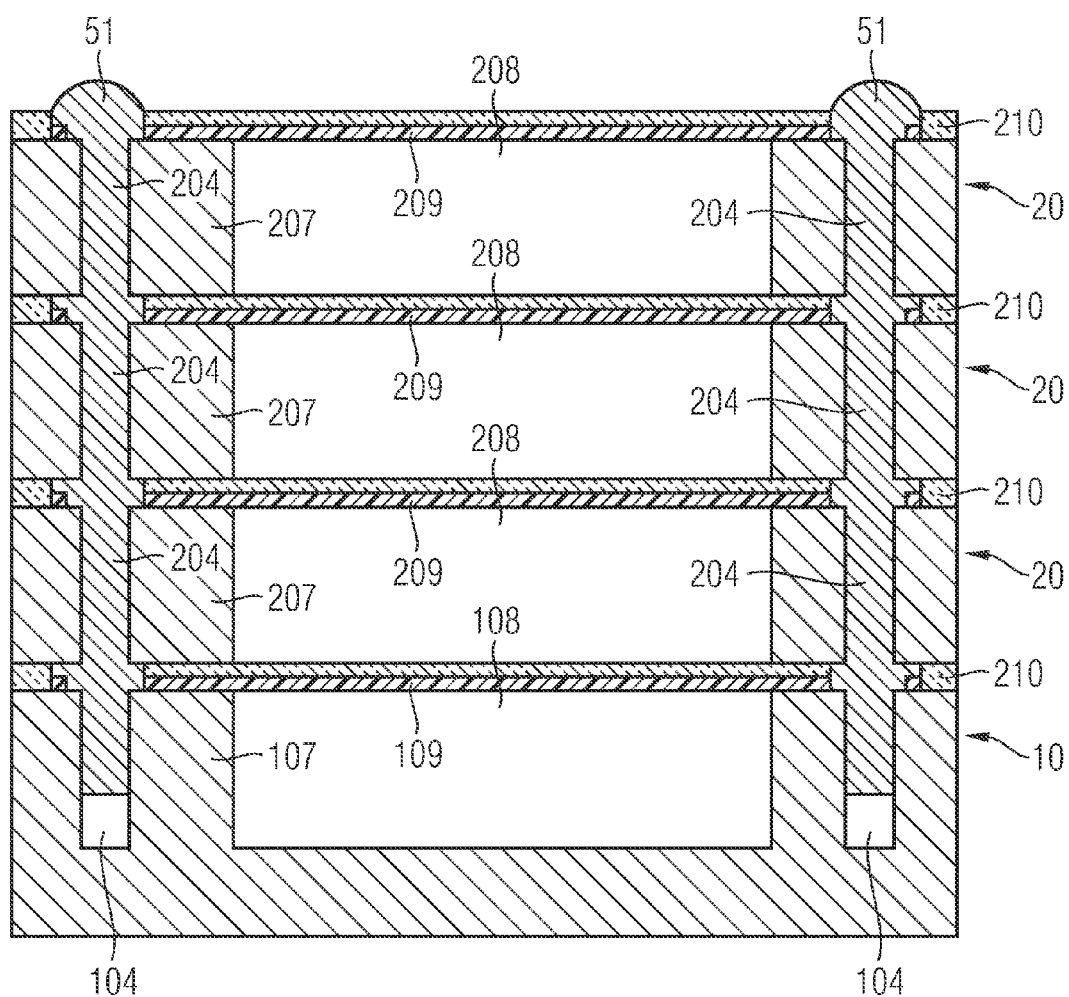
FIG. 4 illustrates a schematic illustration of an integrated in line with a fourth embodiment of the present invention.

FIG. 4 illustrates a substrate stack including a first substrate 10 and a plurality of second substrates 20. In this embodiment of the present invention, the first substrate 10 includes a chip 108 and a frame 107, and the second substrates 20 include a chip 208 and a frame 207. In this embodiment, the frames 107, 207 may be embedded with a molding compound, for example, they may include an embedded polymer. In addition, the individual substrates include an interposer 109, 209 which may include a redistribution layer and which may accordingly route electrical signals from the chips 108, 208 to the through hole 204 and to the blind hole 104 to make appropriate contact. In this context, an intermediate layer 210 may include a passivation layer and/or an adhesive layer. The interposers 109, 209 can be produced by a sputtering method, a plating method or other customary lithographic processes, for example. The intermediate layer 210 can be applied and patterned by means of printing, spray coating, spin coating, or other customary lithographic processes.

In this embodiment, the through holes 204 and the blind holes 104 are arranged in the frames 107, 207. In addition, the making of these holes can again include first of all forming a blind hole from a first side and thinning down the substrate from a second side which is opposite the first side. While the substrates are being stacked, adhesive, which the intermediate layers 210 may contain, can be hardened. In this case, the hardening can be carried out sequentially, that is, after every addition of a substrate, or for the entire stack.

The through contacts 51 then accordingly connect the interposers 109, 209 of the substrates 10, 20. When the liquid conductive material has been inserted into the channels including the through holes 204 and the blind holes 104, cooling can take place more quickly from the front than from the back. It may thus be possible for liquid conductive material from the blind holes 104 to compensate for the shrinkage in the volume during solidification of the conductive material, and thus to ensure a constant and reliable through contact 51 with connection of all substrates.

Figure 5A:
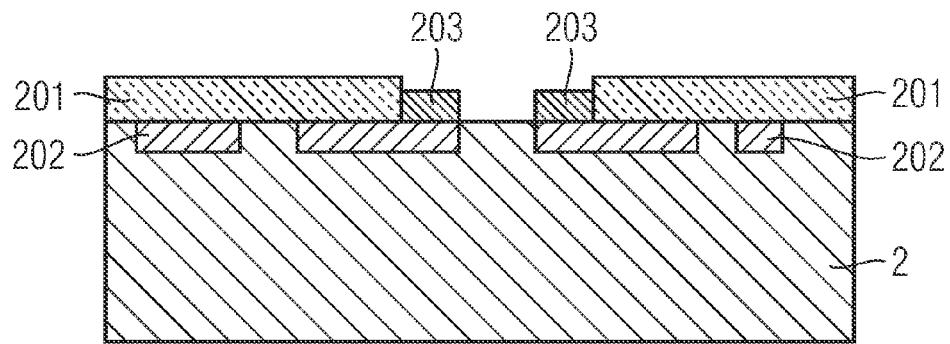
FIGS. 5A through 5G illustrate schematic illustrations of a substrate in various stages during manufacturing in line with a fifth embodiment of the present invention.

FIG. 5A schematically illustrates a second substrate 2 including functionalized regions 202. Within the context of an integrated circuit, the functionalized regions 202 may be interconnects, insulation or diffusion barriers, doped regions or else dielectric structures, for example. One surface of the second substrate 2 also includes a passivation layer 201 arranged on it. An opening in the passivation layer 201 also includes a wettable region 203 arranged in it. With regard to possible materials and production methods, reference is made to the description of FIG. 1A.

Figure 5B:
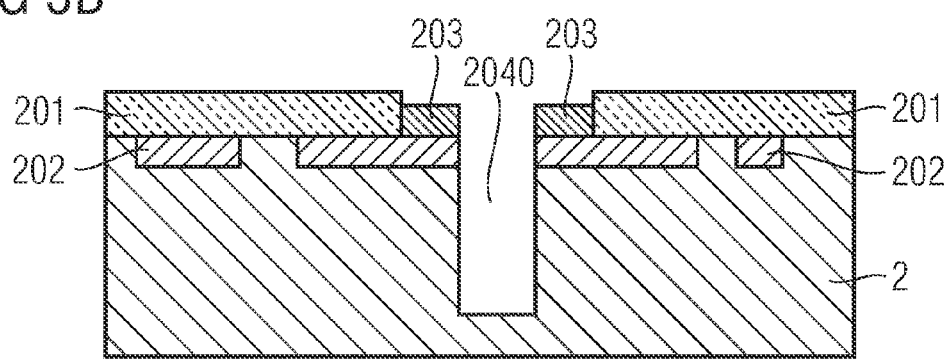

As FIG. 5B illustrates, a blind hole 2040 is arranged in an opening in the wettable regions 203 in the second substrate 2. The hole 2040 can be made by customary methods, such as anisotropic etching, dry etching, anisotropic wet etching, etching with the assistance of an electrical field or laser etching. The diameter of the blind hole 2040 may be typically in a range of 100 nm to 10 μm. The depth is dependent on an aspect ratio, defined as the ratio between the hole depth and the hole width or diameter, in a range of 2 to 10, but typically greater than 3. A blind hole pressure is produced in the blind hole 2040, the blind hole pressure being able to correspond to a low pressure, for example, in a range of 0.5 mbar to 100 mbar.

Figure 5C:
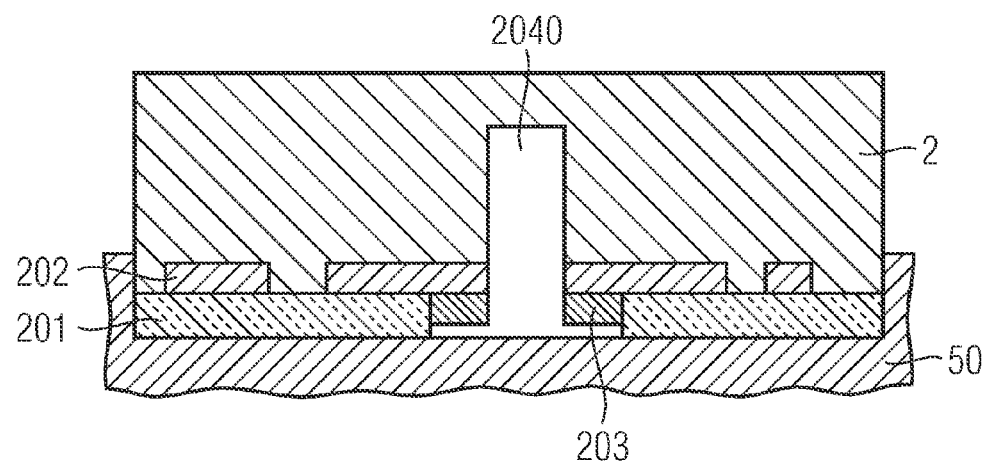
Figure 5D:
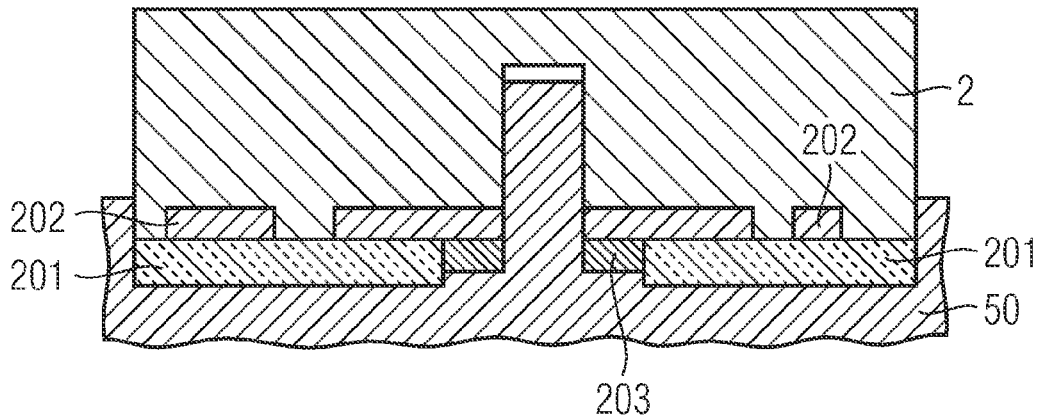

As FIG. 5C illustrates, the second substrate including the blind hole 2040 and the blind hole pressure which prevails therein is dipped into a liquid conductive material 50. An ambient pressure on the liquid conductive material 50 is then increased in comparison with the blind hole pressure, so that the blind hole 2040 is at least partially filled with the conductive material 50, as FIG. 5D illustrates. The ambient pressure on the liquid conductive material 50 can be increased to atmospheric pressure, essentially 1 bar. In addition, the ambient pressure can be increased to a pressure in a range between 1 bar and 5 bar in order to adjust the filling of the blind hole 2040 with the liquid conductive material 50 and also possibly in order to match the ambient pressure to the initial blind hole pressure during dipping for the purpose of adequate filling.

Figure 5E:
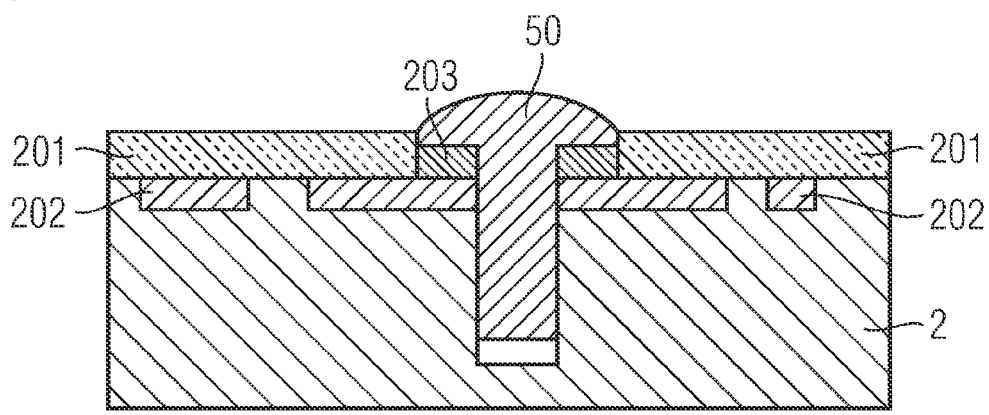

As FIG. 5E illustrates, the second substrate 2 is removed from the liquid material, and conductive material 50 remains in the blind hole 2040. A material 50 which can be liquefied by heating can solidify in the blind hole 2040 as a result of appropriate cooling and can thus remain in stable fashion in the blind hole, regardless of the ambient pressure 2040.

Figure 5F:
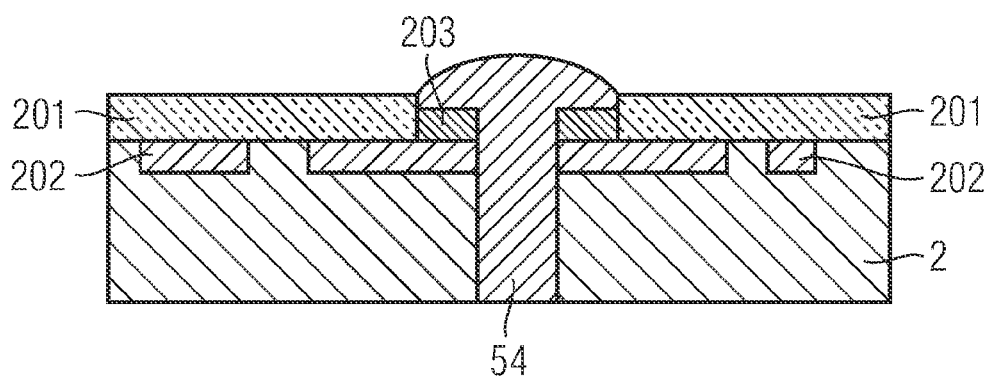

As FIG. 5F illustrates, the second substrate 2 is flattened from the underside. This can be done using a polishing process, such as chemical mechanical polishing (CMP), for example. When the blind hole 2040, or the material 50 in the blind hole 2040, has been reached from below, the flattening process can be terminated. This produces a constant substrate through contact 54 in the second substrate 2.

Figure 5G:
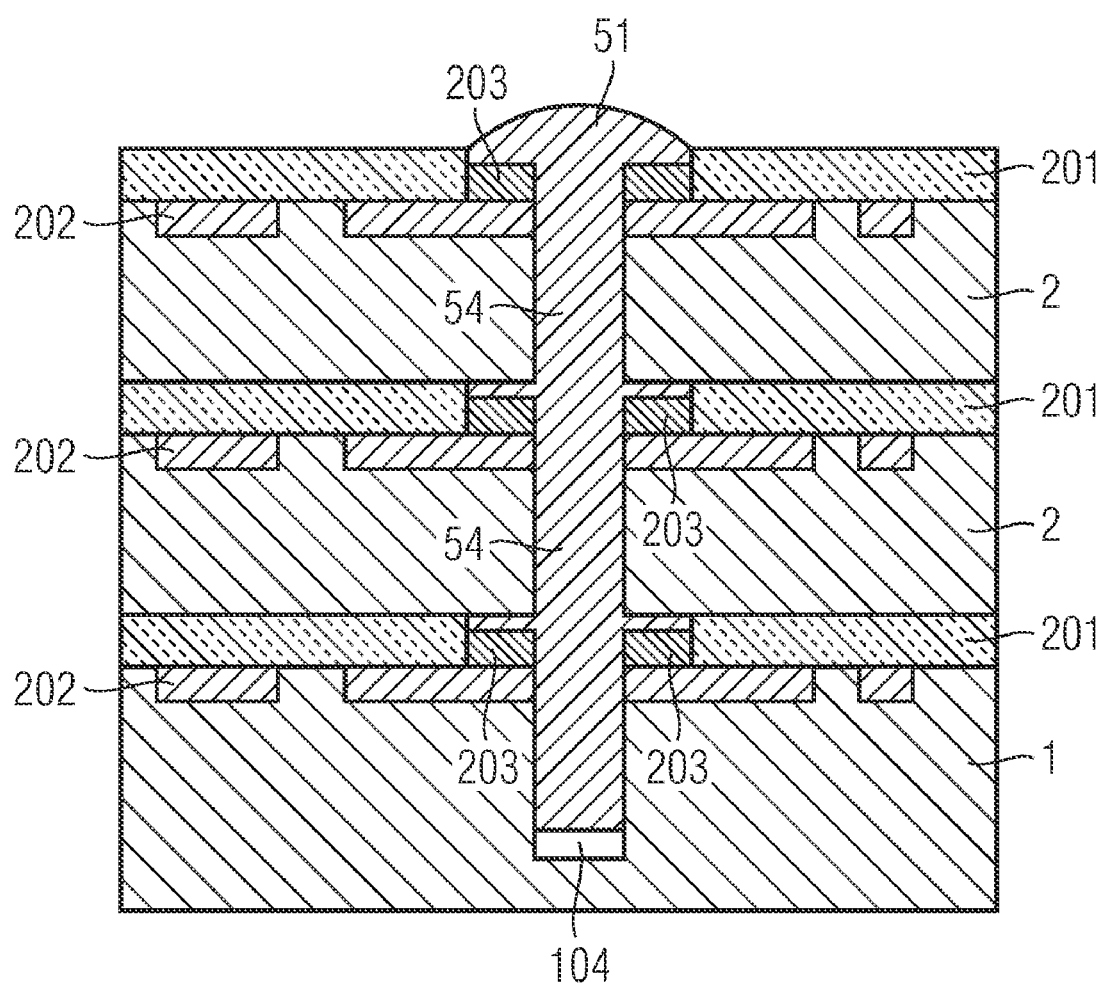

FIG. 5G illustrates a stack including a plurality of second substrates 2 on a first substrate 1. In this case, a blind hole 101 in the first substrate 1 may already have been filled, at least partially, with a conductive material. In a similar way as described in conjunction with FIG. 2C, 3, or 4, a through contact 51 is thus produced by the substrate through contacts 54 and the conductive material in the blind hole 104 between the wettable regions 203, or relevant functionalized regions 202 in the substrates 1, 2. With regard to passivation layers, partial metalliations, frames, intermediate layers or interposers, reference is made to the relevant combination options with the embodiments as they have been described in conjunction with FIGS. 2C, 3, and 4.

Figure 6A:
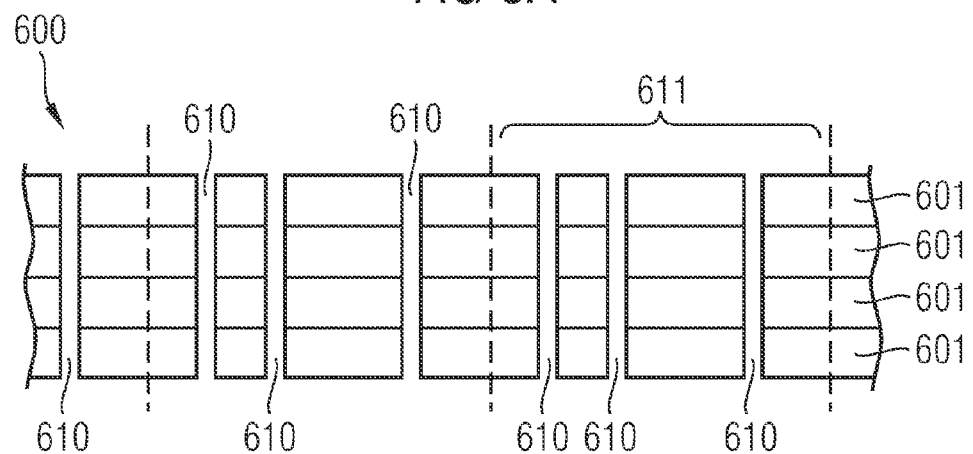

FIGS. 6A through 6D illustrate a substrate stack in various stages during production in line with a sixth embodiment of the present invention. FIG. 6A illustrates a substrate stack 600 including substrates 601. The substrates 601 may be or include entire wafers, such to form a stack of wafers, or, in other words, a so-called wafer stack. The substrates 601 include a through hole 610. The substrates 601 are stacked such that the through holes 610 form a continuous channel from a bottom side from the substrate stack 600 to a top side of the substrate stack 600. A diameter of the continuous channels and/or through holes 610 may be in a range of 5 to 10 microns. Areas 611 of the substrate stacks 600 include a single circuit entity, such as an integrated circuit, an electronic integrated circuit, or an integrated chip.

Once the processing according to this embodiment of the present invention is complete, the substrate stack 600 may be cut at the borders of the areas 611 in order to provide individual integrated circuits, which may then be connected to a carrier substrate and/or packed in an IC package. Cutting may be effected by means of cleaving, cutting, and/or sawing. The substrates 601 may include a semiconductor substrate, such as a silicon substrate, in turn including optical and/or electronic entities, such as transistors, resistors, conductors, capacitors, diodes, light emitting diodes, lasers, light sensors, and/or sensors.

Figure 6B:
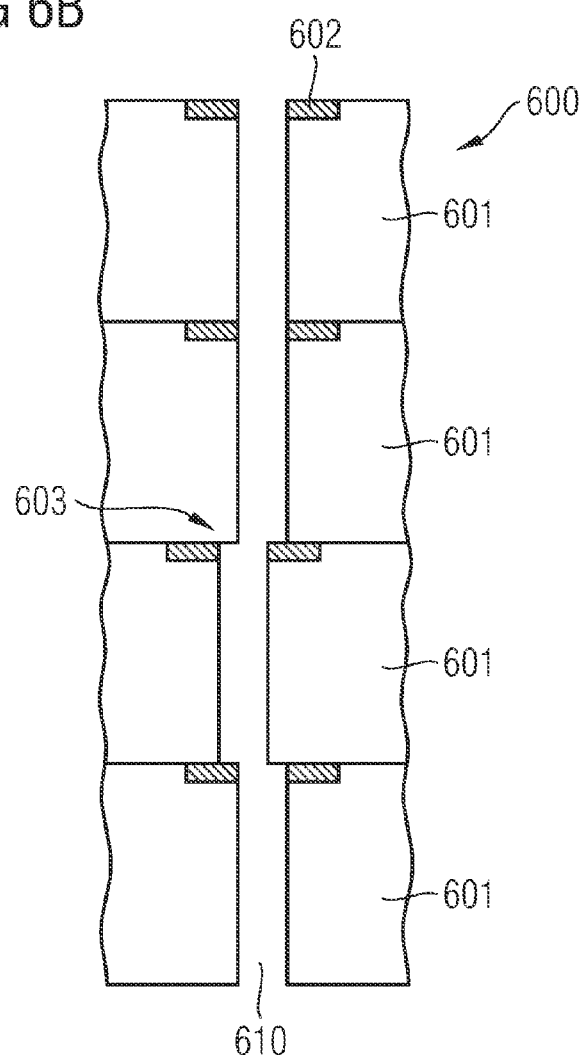

FIG. 6B illustrates a magnified view of the substrate stack 600 in line with the sixth embodiment of the present invention. The continuous channel formed by the through holes 610 of the substrates 601 may include a misalignment 603.

Although it is assumed that the alignment of the individual substrates 601 and the respective through holes 610 is such that apertures of the through holes 610 overlap of most of their area, a misalignment 603 may still be acceptable, since a conductive material may still be able to flow around the misalignment 603 and consequently fill a continuous channel of the through holes 610. A misalignment 603, in line with this embodiment of the present invention, may be acceptable up to 10 percent, 30 percent, or up to 45 percent of an average aperture diameter, the aperture being a cross section of a through hole 610.

FIG. 6C illustrates the substrate stack 600 after being filled with a conductive material 604 according to an embodiment of the present invention. The conductive material 604 may fill the entire continuous channel formed by the through holes 610 and may establish an electric contact to a contact pad and/or contact sleeve 602 of a substrate 601. The contact pad or contact sleeve 602 may establish an electric contact to an electronic and/or optical entity, such as a functionalized entities, regions, or elements, of the substrate 601.

FIG. 6D illustrates the substrate stack 600 as has been illustrated and described already in conjunction with FIG. 6C. However, an optional contact ball 605, such as a solder ball or bead, is arranged on the top contact pad and/or contact sleeve 602 of the top substrate 601. The contact ball 605 may be part of a ball grid array, in order to connect a ready device to a circuit system, including, for example a carrier substrate and/or a printed circuit board.

Figure 7A:
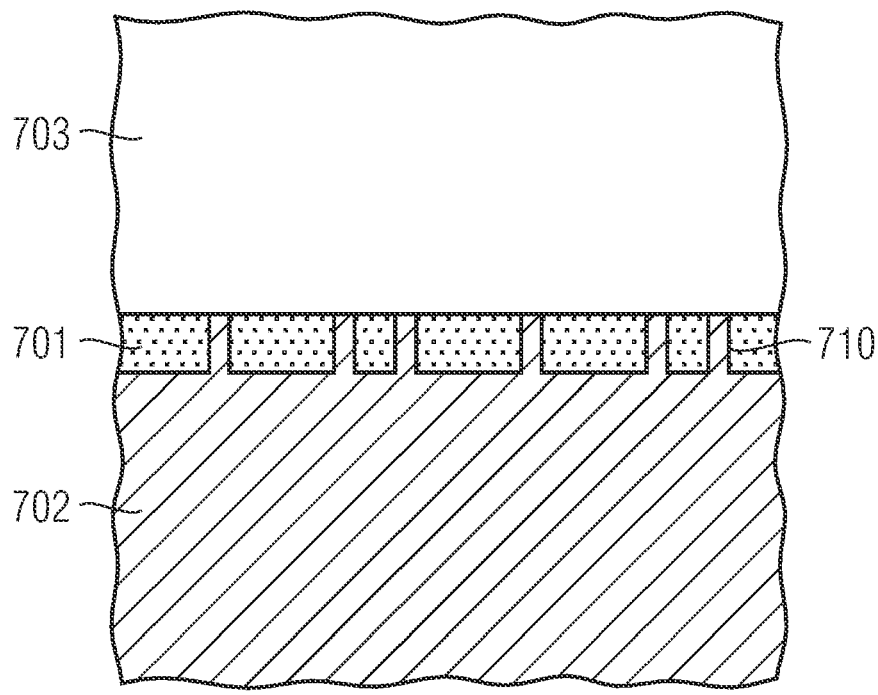
FIGS. 7A and 7B illustrate schematic illustrations of a substrate in various stages during manufacturing in line with a seventh and an eighth embodiment of the present invention.
Figure 7B:
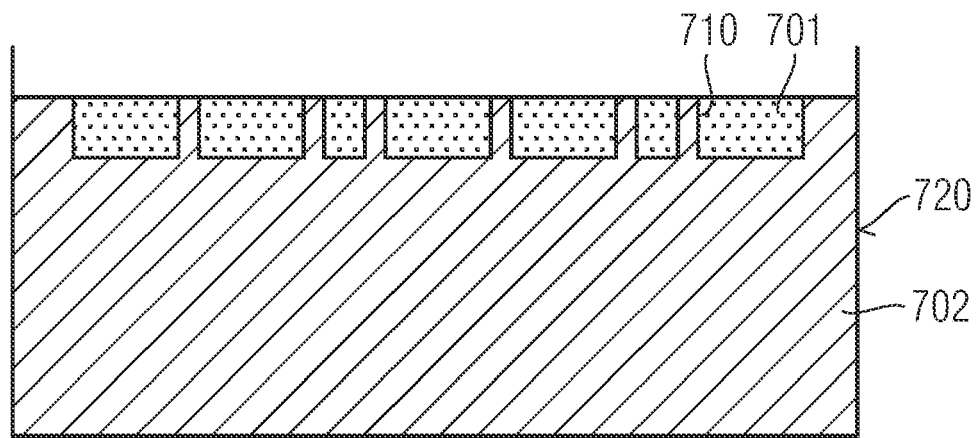

FIGS. 7A and 7B illustrate arrangements to fill continuous channels of a substrate stack in line with a seventh and an eighth embodiment of the present invention. FIG. 7A illustrates the filling of continuous channels of a substrate stack 701 by means of a pressure difference in line with a seventh embodiment of the present invention. The substrate stack 701 may include a substrate stack, such as the substrate stack 600, as described in conjunction with FIGS. 6A through 6A, or any other stack of the substrate stacks as they have been described in conjunction with the embodiments of the present invention.

A liquid conductive material 702 is arranged adjacent to a first surface of the substrate stack 701. The liquid conductive material 702 may include a metal solder. This first surface may be a bottom surface, since gravity may provide a smooth surface of the liquid conductive material 702, on which the substrate stack 701 may be placed. Adjacent to a second surface of the substrate stack 701, such as a top surface, there is an environment 703. The environment 703 may include atmosphere and/or a well-defined process atmosphere.

According to this embodiment of the present invention, a pressure difference between the pressure of the liquid conductive material 702 and the pressure of the environment 703 is employed in order to fill the continuous channels of the substrate stack 701 with the liquid conductive material 702. The pressure difference may be provided by increasing the pressure of the liquid conductive material 702, by decreasing the pressure of the environment 703, or by increasing the pressure of the liquid conductive material 702 as well as decreasing the pressure of the environment 703. The pressure difference can be also provided by exerting mechanical pressure on the substrate stack 701 towards the liquid conductive material 702. An absolute pressure difference may be in a range of 10 mbar to 100 mbar, 100 mbar to 1 bar, or 1 bar to 5 bar. Furthermore, the pressure of the environment 703 may be equal to a vacuum, well below 1 mbar.

After filling the continuous channels, a pressure equalization of the pressure of the liquid conductive material 702 and the environment 703 may take place in order to remove the substrate stack 701 from the liquid conductive material 702 and/or the environment 703, while leaving the liquid conductive material 702 in the continuous channels. The process according to this embodiment of the present invention may include a heating of the substrate stack 701 prior to the placing and/or insertion of the substrate stack 701 on the liquid conductive material 702, for example a heating to a temperature of the liquid conductive material 702. The process according to this embodiment may further include a cooling of the substrate stack 701 after filling the continuous channels in order to solidify the liquid conductive material 702 and to form a through contact. This cooling may take place from a top side towards the environment 703, such as a gradual solidification. This may enable a separation of the stack 701 from the liquid conductive material 702 while the continuous channels still remain filled, since the conductive material in a top area of the continuous channels may have been already solidified and may thus act as a plug and avert an emptying of the channels.

For this purpose, the temperature of the environment 703 and/or the top of the substrate stack 701 may be held just below the melting temperature of the conductive material 702, whereas the liquid conductive material 702 is held just above the melting temperature of the conductive material 702. The variation from the melting temperature of the conductive material 702 may be up to 1K, or up to 10 K. Capillary forces may further assist the filling of the continuous channels, assist during separation of the stack from the conductive material, and/or may assist in the compensation of a shrinkage of the conductive material 702 upon solidification. Furthermore, the pressure difference may be maintained, the continuous channel remain filled with the conductive material upon releasing the wafer stack upwards. Solidification may start on the top. By means of the capillary effect the remainder of the continuous channel may remain filled with the liquid conductive material 702 and the remainder of the liquid material 702 may now solidify in order to provide a through contact.

FIG. 7B illustrates the filling of continuous channels of the substrate stack 701 in line with an eighth embodiment of the present invention. A bath 710 includes the liquid conductive material 702. According to this embodiment of the present invention, the substrate stack 701 is submerged, dipped, and/or inserted into the liquid conductive material 702, such that the continuous channels of the through holes 710 of the substrate stack 701 are filled by the liquid conductive material 702. Capillary forces and/or wetting forces may allow for an extraction of the substrate stack 701 from the liquid conductive material 702, while the continuous channels and/or through holes 710 may remain filled with the liquid conductive material 702. As far as the separation and/or tempering are concerned it is referred here to the description in conjunction with FIG. 7A.

Figure 8A:
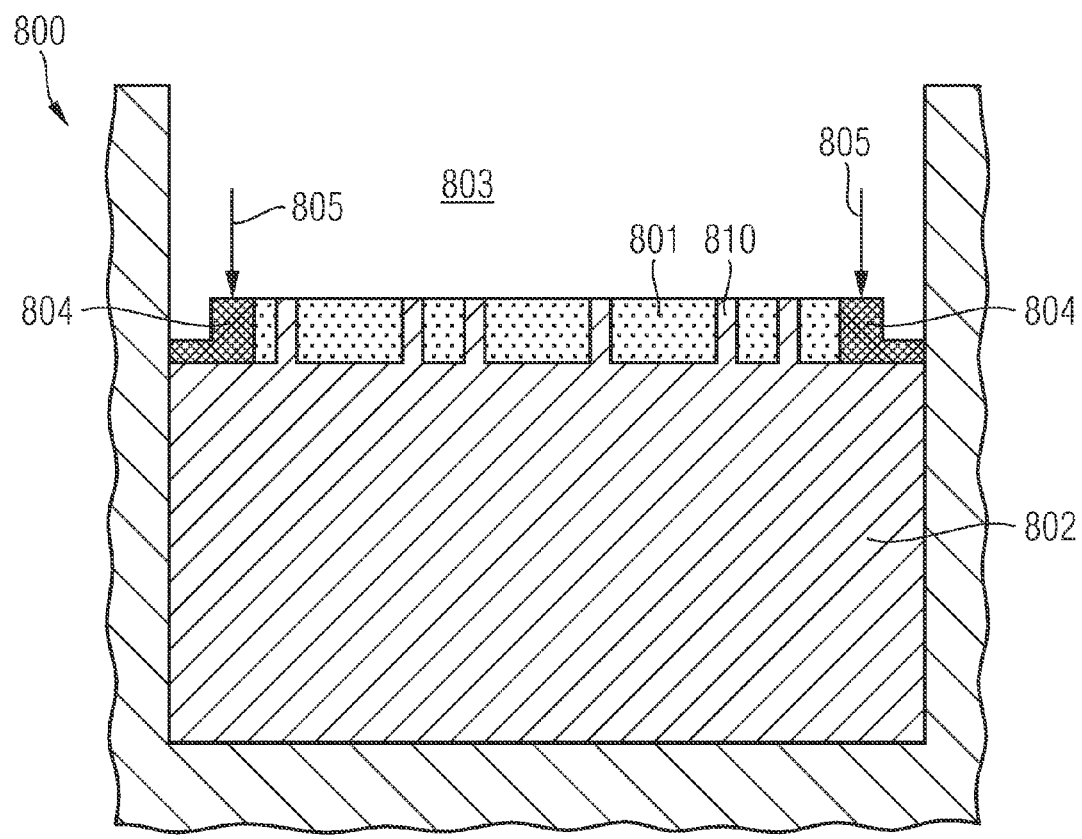
FIGS. 8A and 8B illustrate schematic illustrations of an apparatus in line with a ninth embodiment of the present invention.

FIGS. 8A and 8A illustrate an arrangement for filling continuous channels and/or through holes of a substrate stack according to a ninth embodiment of the present invention. An apparatus 800 includes a bath of a liquid conductive material 802. A frame 804 holds a substrate stack 801 and may include a sliding seal, such as a sealing lip, a sealing ring, or an O-ring, which may allow for a vertical motion of the frame 804 within the apparatus 800, while preventing material, liquids, or gases to evade the substrate stack 801. In this way, the substrate stack 801 separates the liquid conductive material 802 from an environment 803.

Continuous channels and/or through holes 810 of the substrate stack 801 may be filled by the liquid conductive material 802 by means of a down motion, in direction of the arrows 805, and or a pressure difference between a pressure of the liquid conductive material 802 and the environment 803. The substrate stack 801 may include a substrate stack, such as the substrate stack 600, as described in conjunction with FIGS. 6A through 6A, or any other stack of the substrate stacks as they have been described in conjunction with the embodiments of the present invention. As far as the pressure difference is concerned it is referred here to the description in conjunction with FIG. 7A. As far as the separation and/or tempering are concerned it is referred here to the description in conjunction with FIG. 7A. In addition, the apparatus 800 may include means for tempering the environment 803 and/or the top surface of the substrate stack 801, and/or a heating system to control the bath temperature of the conductive material 802. Furthermore, the apparatus may include a standard process chamber which may be suitable to conduct conventional processes. This may include a modification of a galvanic tank or chamber, which may be used for standard wafer level galvanic processes, such as metal plating.

Figure 8B:
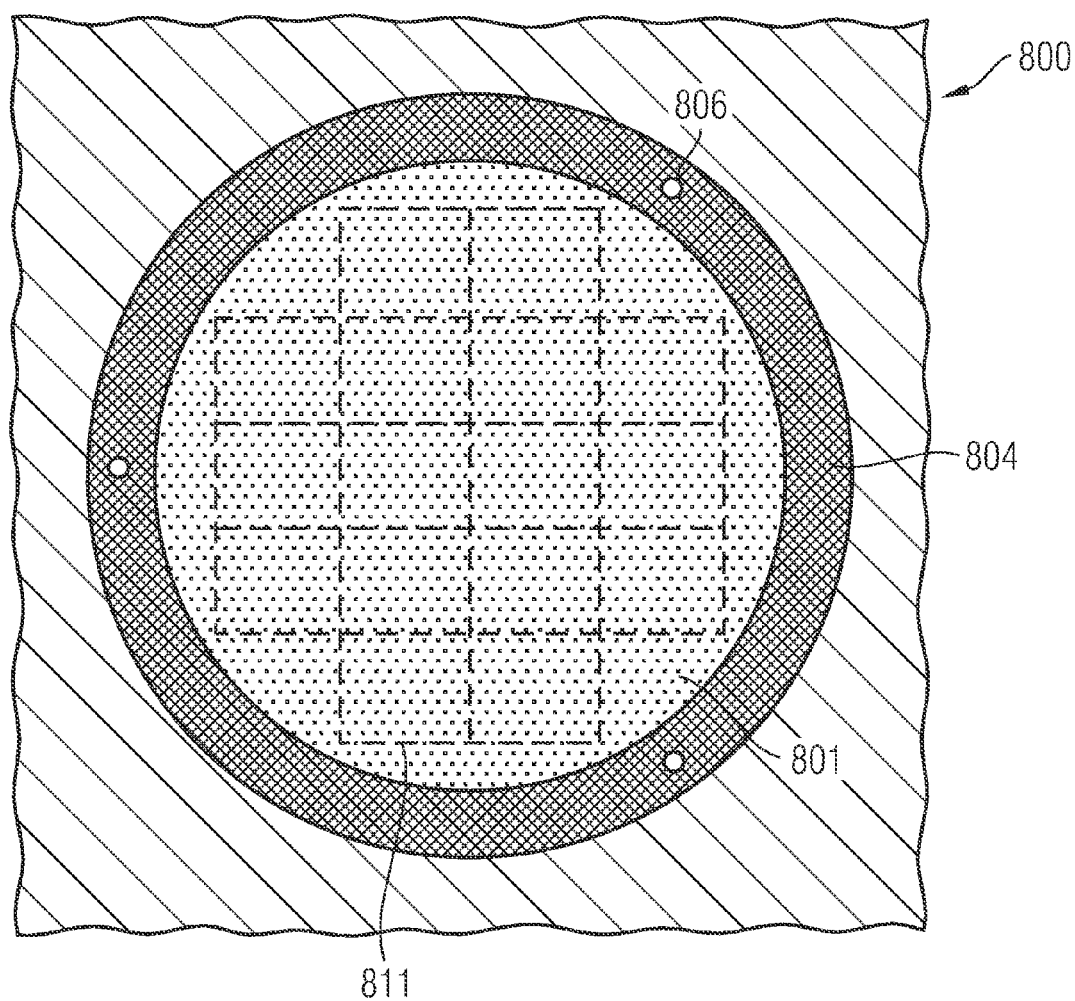

FIG. 8B illustrates a top view of the apparatus 800. The circular frame 804 holds the substrate stack 801. Although the frame 804 and the substrate stack 801 posses a circular shape as illustrated in form of a ring, the frame 804 and/or the substrate stack 801 may also posses a shape different from a circular shape, such as a rectangular shape. The frame 804 may include means 806 for a vertical motion of the frame 804, as described already with conjunction of FIG. 8A. The substrate stack 801 may include regions 811, that include a single integrated circuit, a single electronic integrated circuit, and/or a chip, which may be cut afterwards in order to provide individual circuits or chips for ready devices.

In one embodiment, a method allows for an interconnection of all the different devices of a stack of wafers, or wafer level filling of through vias, and/or through silicon vias, which may be effected for 3D integration or multiple 3D wafer stacking. In this context, the vias may run through the entire stack thickness, that is, from the bottom surface to the top surface of a wafer stack. Thus an effective and void-free via filling may be provided. This may be provided by means of liquid metal injection or pressure metal injection in line with an embodiment of the present invention.

In one embodiment, a misalignment present in the substrate stack or wafer stack and/or through via defects, which may be caused by such a misalignment, may be overcome In one embodiment, once injection has completed, a first drop at the top surface may solidify. This drop or bead may form a connection ball, in turn, being part of a ball grid array.

In one embodiment, a pressure may be applied or provided to a hole, to a surface, to a substrate, to a material, and/or to a surrounding.

The preceding description only describes exemplary embodiments of the invention. The features disclosed therein and the claims and the drawings can, therefore, be essential for the realization of the invention in its various embodiments, both individually and in any combination. While the foregoing is directed to the embodiments of the present invention, it will be appreciated by those of ordinary skill in the art that a variety of other and further embodiments of this invention may be devised without departing from the basic scope of the invention, the scope of the present invention being determined by the claims that follow. Therefore, it is intended that this invention be limited only by the claims and the equivalents thereof.

What is claimed is:

1. A method of fabricating an electrical contact, the method comprising:
   providing a first substrate comprising at least one contact pad on any of a first surface and of a second surface;
   providing at least one second substrate comprising at least one through hole from a first surface to a second surface;
   stacking the second substrate on the first substrate, such that the through hole of the second substrate at least overlaps with the contact pad of the first substrate;
   applying a first ambient low pressure to the through hole;
   providing a liquid conductive material to the through hole;
   applying a second ambient pressure to the liquid conductive material until the through hole is at least partly filled with the liquid conductive material; and
   taking the stack of substrates off the liquid conductive material.

2. The method as claimed in claim 1, the providing of the through hole comprising:
   a providing of a blind hole on the first surface of the second substrate; and
   a flattening of the second substrate from the second surface, the second surface being an opposite surface to the first surface.

3. The method as claimed in claim 1, the first low pressure being below atmospheric pressure and the second pressure being increased to atmospheric pressure.

4. The method as claimed in claim 1, the first low pressure being below atmospheric pressure and the second pressure being increased to a pressure being in the range of 1 bar to 5 bar.

5. The method as claimed in claim 1, first low pressure being at atmospheric pressure and the second pressure being increased to a pressure being in the range of 1 bar to 5 bar.

6. The method as claimed in claim 1, the stack of substrates being heated prior to applying the liquid conductive material.

7. The method as claimed in claim 1, the method comprising a providing of a passivating coating on an inner wall of the through hole.

8. The method as claimed in claim 1, the providing of the first substrate comprising a providing of a blind hole in the first substrate in an area of the contact pad.

9. The method as claimed in claim 8, the increasing the second pressure being such that the through hole and the blind hole in the first substrate are at least in part filled by the liquid conductive material.

10. The method as claimed in claim 8, the method comprising a providing of a passivating coating on an inner wall of the blind hole of the first substrate.

11. The method as claimed in claim 8, the method comprising a providing of a passivating coating on a bottom side of the second substrate.

12. The method as claimed in claim 1, a ball comprising the conductive material being formed on the top second substrate in an area of the through contact after the solidifying of the liquid conductive material.

13. The method as claimed in claim 1, the conductive material comprising a soldering metal.

14. A method of fabricating an electrical contact, the method comprising:
   providing a first substrate comprising at least one contact pad;
   providing at least one second substrate comprising at least one blind hole on a first surface of the second substrate;
   applying a first ambient low pressure in the blind hole;
   providing a liquid conductive material to the blind hole;
   applying a second ambient pressure acting to the liquid conductive material, such that the blind hole is at least partly filled with the liquid conductive material;
   taking the second substrate off the liquid conductive material;
   flattening the second substrate from a second surface, the second surface being an opposite surface to the first surface, such that the blind hole is opened and a through contact through the second substrate is provided; and
   stacking the first substrate and the at least one second substrate, such that the through contact of the second substrate overlaps with the contact pad of the first substrate, such, that the electrical contact is provided to the through contact.

15. The method as claimed in claim 14, the method comprising after stacking the substrates a heating of the stack of substrates and a providing of an electrical connection from the through contact to the contact pad.

16. The method as claimed in claim 14, the first low pressure being below atmospheric pressure and the second pressure being increased to atmospheric pressure.

17. The method as claimed in claim 14, the first low pressure being below atmospheric pressure and the second pressure being increased to a pressure being in the range of 1 bar to 5 bar.

18. The method as claimed in claim 14, the first low pressure being at atmospheric pressure and the second pressure being increased to a pressure being in the range of 1 bar to 5 bar.

19. The method as claimed in claim 14, the second substrate being heated to the temperature of the liquid conductive material.

20. The method as claimed in claim 14, the method comprising a providing of a passivating coating on an inner wall of the blind hole.

21. The method as claimed in claim 14, the providing of the first substrate comprising a providing of a blind hole in the first substrate in an area of the contact pad.

22. The method as claimed in claim 21, the providing of the first substrate comprising an at least in part filling of the blind hole with the conductive material.

23. The method as claimed in claim 21, the method comprising a providing of a passivating coating on an inner wall of the blind hole of the first substrate.

24. The method as claimed in claim 14, the method comprising a providing of a passivating coating on a bottom side of the second substrate.

25. The method as claimed in claim 14, a ball comprising the conductive material being formed on the top second substrate in an area of the through contact after the solidifying of the liquid conductive material.

26. The method as claimed in claim 14, the conductive material comprising a soldering metal.

27. A method of fabricating an electrical contact, the method comprising:
   providing a first substrate comprising a through hole and a contact pad, the contact pad being arranged on a surface of the first substrate in an area of an aperture of the through hole;
   providing at least one second substrate comprising a through hole and a contact pad, the contact pad being arranged on a surface of the second substrate in an area of an aperture of the through hole;
   stacking the second substrate on top of the first substrate, such that the aperture of the through hole of the first substrate at least in part overlaps with the aperture of the through hole of the second substrate;

providing a liquid conductive material adjacent to an exposed surface of the first substrate; and applying a first ambient pressure to the through hole and a second ambient pressure to the liquid conductive material, such that the through hole of the first substrate and the second substrate are filled with the liquid conductive material.

28. The method as claimed in claim 27, the first pressure being below atmospheric pressure and the second pressure of the liquid conductive material being increased to atmospheric pressure.

29. The method as claimed in claim 27, the first pressure being below atmospheric pressure and the second pressure being increased to a pressure in a range of 1 bar to 5 bar.

30. The method as claimed in claim 27, the first pressure being at atmospheric pressure and the second pressure being increased to a pressure in a range of 1 bar to 5 bar.

31. The method as claimed in claim 27, the stack of substrates being heated prior to the providing a liquid conductive material adjacent to an exposed surface of the first substrate.

32. The method as claimed in claim 27, the method comprising a providing of a passivating coating on an inner wall of the through holes.

33. The method as claimed in claim 27, the method comprising a providing of a passivating coating on a bottom side of the second substrate.

34. The method as claimed in claim 27, a ball comprising the conductive material being formed on the top second substrate in an area of the aperture of the through hole after solidifying the liquid conductive material.

35. The method as claimed in claim 27, the conductive material comprising a soldering metal.

36. A method of fabricating an electrical contact, the method comprising:

providing a first substrate comprising a through hole and a contact pad, the contact pad being arranged on a surface of the first substrate in an area of an aperture of the through hole;

providing at least one second substrate comprising a through hole and a contact pad, the contact pad being arranged on a surface of the second substrate in an area of an aperture of the through hole;

stacking the second substrate on top of the first substrate, such that the aperture of the through hole of the first substrate at least in part overlaps with the aperture of the through hole of the second substrate;

providing a bath of a liquid conductive material; and applying the stack of substrates to the bath of the liquid conductive material and applying a first ambient pressure to the through hole and a second ambient pressure to the liquid conductive material, such that the through holes of the first substrate and the second substrate are filled with the liquid conductive material.

37. The method as claimed in claim 36, the stack of substrates being heated prior to the providing a liquid conductive material adjacent to an exposed surface of the first substrate.

38. The method as claimed in claim 36, the method comprising a providing of a passivating coating on an inner wall of the through holes.

39. The method as claimed in claim 36, the method comprising a providing of a passivating coating on a bottom side of the second substrate.

40. The method as claimed in claim 36, a ball comprising the conductive material being formed on the top second substrate in an area of the aperture of the through hole after solidifying the liquid conductive material.

41. The method as claimed in claim 36, the conductive material comprising a soldering metal.

* * * * *